United States Patent
Atanackovic (10) Patent No.: US 7,675,117 B2
(45) Date of Patent: Mar. 9, 2010

(54) MULTI-GATE FIELD EFFECT TRANSISTOR

(75) Inventor: Petar Atanackovic, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 629 days.

(21) Appl. No.: 11/559,690

(22) Filed: Nov. 14, 2006

(65) Prior Publication Data

US 2008/0111195 A1    May 15, 2008

(51) Int. Cl.
*H01L 29/78* (2006.01)
*H01L 21/336* (2006.01)

(52) U.S. Cl. .............. 257/366; 257/E29.132; 257/E21.625; 438/283

(58) Field of Classification Search ........... 257/250, 257/310, 342, 365, E29.132; 438/283; 252/521.1
See application file for complete search history.

(56) References Cited

U.S. PATENT DOCUMENTS

| | | | |
|---|---|---|---|
| 6,404,027 B1 * | 6/2002 | Hong et al. ............ 257/410 |
| 6,501,121 B1 | 12/2002 | Yu et al. | |
| 6,518,634 B1 | 2/2003 | Kaushik et al. | |
| 6,528,377 B1 | 3/2003 | Mihopoulos et al. | |
| 6,610,548 B1 | 8/2003 | Ami et al. | |
| 6,638,872 B1 | 10/2003 | Croswell et al. | |
| 6,734,453 B2 | 5/2004 | Atanackovic et al. | |
| 6,943,385 B2 | 9/2005 | Usuda et al. | |
| 7,037,806 B1 | 5/2006 | Atanackovic | |
| 7,199,451 B2 | 4/2007 | Kelman | |
| 7,323,396 B2 | 1/2008 | Atanackovic et al. | |
| 7,355,269 B1 | 4/2008 | Lebby | |
| 7,364,974 B2 | 4/2008 | Atanackovic | |
| 7,365,357 B2 | 4/2008 | Atanackovic et al. | |
| 7,384,481 B2 | 6/2008 | Atanackovic | |
| 7,432,569 B1 | 10/2008 | Atanackovic | |
| 7,476,600 B1 | 1/2009 | Atanackovic | |
| 7,498,229 B1 | 3/2009 | Atanackovic | |
| 2003/0008521 A1 * | 1/2003 | Bojarczuk et al. ........... 438/752 |
| 2004/0094758 A1 * | 5/2004 | Usuda et al. ................ 257/18 |
| 2005/0156155 A1 * | 7/2005 | Atanackovic ............... 257/19 |
| 2005/0161663 A1 * | 7/2005 | Atanackovic ............... 257/19 |
| 2005/0161773 A1 * | 7/2005 | Atanackovic ............. 257/632 |
| 2005/0163692 A1 * | 7/2005 | Atanackovic ............. 423/263 |
| 2005/0166834 A1 * | 8/2005 | Atanackovic ............... 117/84 |
| 2006/0060826 A1 | 3/2006 | Atanackovic | |
| 2006/0065930 A1 | 3/2006 | Kelman | |
| 2007/0018166 A1 | 1/2007 | Atanackovic | |
| 2008/0093670 A1 | 4/2008 | Atanakovic | |
| 2008/0111186 A1 | 5/2008 | Atanackovic | |
| 2008/0135924 A1 | 6/2008 | Lebby | |
| 2008/0150031 A1 | 6/2008 | Atanackovic | |
| 2008/0241519 A1 | 10/2008 | Schroeder | |
| 2009/0085115 A1 | 4/2009 | Atanackovic | |

OTHER PUBLICATIONS

U.S. Appl. No. 11/393,629, Atanackovic, Petar B.
U.S. Appl. No. 11/472,087, Atanackovic, Petar B.

* cited by examiner

*Primary Examiner*—David Vu
*Assistant Examiner*—Earl N Taylor
(74) *Attorney, Agent, or Firm*—Fernandez & Associates, LLP (57) ABSTRACT

A planar, double-gate transistor structure comprising upper and lower gate stacks that each comprises a single-phase high-K dielectric gate dielectric is disclosed. The transistor structure is particularly suitable for fully-depleted silicon-on-insulator electronics having gate-lengths less than 65 nm.

39 Claims, 7 Drawing Sheets

MULTI-GATE FIELD EFFECT TRANSISTOR

CROSS REFERENCE TO RELATED APPLICATIONS

The underlying concepts, but not necessarily the language, of the following cases are incorporated by reference:

(1) U.S. patent application Ser. No. 11/253,525, filed 19 Oct. 2005; and (2) U.S. patent application Ser. No. 11/254,031, filed 19 Oct. 2005.

If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to integrated circuit devices in general, and, more particularly, to field-effect transistors.

BACKGROUND OF THE INVENTION

Many modern integrated circuits are complicated arrangements of millions of individual elements called Metal-Oxide-Semiconductor Field-Effect Transistors ("MOSFETs"). The remarkable decades-long progression in the performance of state-of-the-art electronics has been enabled by steadily shrinking the size of these transistors. The desired pace of MOSFET device scaling has the gate-length (i.e., size) of transistors shrinking to less than 100 nanometers (nm). But achieving this size scale is problematic. In particular, for transistors formed using conventional bulk silicon substrates, performance begins to suffer when gate length is reduced to less than 100 nm. At this size scale, substrate effects and physical limitations associated with silicon dioxide gate dielectric material become severe.

To meet this challenge, new material systems and transistor structures are being considered. Three technologies that have attracted the interest of researchers are:

Fully-depleted silicon-on-insulator technology;
dual-gate transistor technology; and
High-K dielectric materials.

These technologies, and their limitations for use in very short gate-length transistors, are discussed in some detail below.

Silicon-on-insulator (SOI) technology was introduced to overcome some of the limitations on transistor scaling associated with the use of a bulk silicon wafer. An SOI substrate comprises a silicon active layer that is separated from a bulk silicon handle wafer by a buried silicon dioxide layer. Transistors, such as MOSFETs, are formed in the active layer. Many deleterious substrate effects are mitigated by the fact that the transistors are formed in a layer that is insulated from the substrate.

A conventional MOSFET has four electrical terminals, drain, source, gate, and substrate. Structurally, the gate comprises an electrically-conductive polysilicon layer (i.e., a gate conductor) that is disposed on a silicon dioxide layer (i.e., a gate dielectric). The gate dielectric electrically isolates the gate conductor from the active layer, and acts as one plate of a capacitor structure. The region of the active layer that is located directly under the gate is called the channel. Typically, the channel is doped so that it contains either negative charge carriers (electrons) or positive charge carriers (holes). The channel is bracketed by a source and a drain, which are typically doped with a charge carrier opposite to those in the channel. The gate, gate dielectric, and channel reside on substantially parallel planes, and these transistors are referred to as "planar single gate" MOSFETs.

When a voltage is applied to the gate terminal, an electric field is created under the gate, which drives away existing charge carriers in channel. This creates a charge carrier "depletion region" in the channel. For a gate voltage that is sufficiently high (i.e., greater than a "threshold voltage"), a carrier-type "inversion" occurs in the channel and electric current can flow between the source and drain. In other words, the MOSFET is activated by the application of a gate voltage higher than the threshold voltage.

MOSFET transistors having gate lengths greater than 50 to 65 nm typically operate in what is referred to as "partial depletion" mode. In partial depletion mode transistors (PD-SOI), the active layer thickness is typically greater than 200 nm. During operation, the depletion region extends only partly into the active layer (i.e., it is partially-depleted). For transistors having gate-lengths shorter than 50 nm, however, PD-SOI transistor operation suffers from severe short-channel effects and exhibits a poor on/off current ratio.

Full-depletion mode transistor technology (FD-SOI) mitigates some of the problems faced by PD-SOI. FD-SOI is characterized by an active layer that is extremely thin (typically <70 nm). The active layer is thin enough, in fact, that the depletion region extends through the entire thickness of the active layer (i.e., the active layer is "fully-depleted"). As a result, short-channel effects are less severe and transistor operation is improved over PD-SOI.

For transistors having gate-lengths as small as 15-20 nm, however, it is expected that even FD-SOI planar single gate transistor technology will not suffice due to the effects from substrate interactions. Exotic, non-planar transistor technologies, therefore, are being considered. These include vertical double or triple gate MOSFET structures. In these vertical structures, the active layer comprises a "fin" that projects up from the substrate surface. A gate is formed on either side of this fin to form a double-gate transistor. This structure is sometimes referred to as a "FINFET." A triple-gate transistor is formed by an active layer fin having gates formed on both sides and the top. The attraction for these multi-gate devices lies in significantly improved electrostatic integrity and transistor operation.

While multi-gate transistors are attractive for their operational characteristics, the fabrication complexity for vertical gate transistors represents a significant barrier to their widespread use. To date, the integrated circuit industry has been focused primarily upon planar processing technology. Vertical structures (and associated fabrication processes) represent a significant departure from proven technologies. Their fabrication processes are more complex than those used to fabricate planar devices. As a result, manufacturing of vertically-oriented multi-gate transistors is much costlier. In addition, device and circuit designs for vertical transistors are unproven. Finally, orientation of the fin structure with respect to active layer's crystal structure affects the speed at which the charge carriers travel in the vertical active layer. This fact makes circuit layout for vertical transistors much more complicated than for more conventional devices.

As the gate length of the transistor scales below 100 nm, the thickness of the conventional silicon dioxide gate dielectric becomes extremely thin (approximately 2 nm). At this thickness, silicon dioxide no longer provides sufficient electrical isolation. Direct carrier tunneling through these thin oxides increases transistor leakage current and, therefore, integrated circuit power dissipation.

Materials that have a relatively high dielectric constant—so called "high-K dielectrics"—might provide some advantage as a gate dielectric. High-K dielectric materials are therefore being developed in order to replace silicon dioxide in short gate-length transistors (<100 nm). Examples of high-K dielectrics under investigation include hafnium oxide and silicon oxynitride. To the extent that these materials have a higher dielectric constant than silicon dioxide, the same operational characteristics as thin silicon dioxides can be derived with thicker high-K dielectric layers. Alternatively, thin high-K gate dielectrics used in place of thin silicon dioxide gate dielectrics enable transistor operation at lower gate voltage, thereby reducing gate leakage current, etc. To date, however, material quality, morphology issues, and poor interface quality have limited the benefits of high-K dielectric materials vis-à-vis their use as gate dielectrics.

Charge-carrier tunneling through thin silicon dioxide gate dielectrics can also arise due to dopant poisoning of the transistor. Such poisoning can occur during fabrication, as explained below. In typical, conventional SOI-based transistors, the gate conductor is polysilicon. The polysilicon must be doped (typically with boron) in order to make it sufficiently conductive. Once present in the polysilicon, the dopant must be activated by means of a high-temperature anneal. At elevated temperatures, the diffusivity of boron along the grain boundaries of the polysilicon, and through silicon dioxide, is quite high. As a consequence, when subjected to the elevated annealing temperatures, boron can penetrate the gate oxide and enter the channel underneath, thereby poisoning the transistors.

A transistor technology that mitigates at least some of the costs and disadvantages of the prior-art, therefore, would be a significant advance in the state-of-the-art of microelectronics.

SUMMARY OF THE INVENTION

The present invention provides a composition comprising a planar, double-gate transistor having an active layer sandwiched between an upper gate stack and a lower gate stack. Each of the upper and lower gate stacks comprise a high-K gate dielectric that is a rare-earth dielectric having a single-phase crystal structure. The composition provides particular advantages for transistors having gate lengths at or below 65 nm.

In addition, the inventive composition is compatible with planar processing methods, such as those used to fabricate conventional, single-gate MOSFETs. As described in detail later in this specification, single-phase morphology is characterized by a single-crystal, single-domain crystalline structure.

The dielectrics and active layer of the composition are deposited via an epitaxy process. In some embodiments, each of the upper and lower gate stacks also comprise a gate conductor that has a single-crystal crystal structure. In some embodiments, at least one of the upper and lower gate stacks comprises a gate conductor that has single-phase crystal structure.

Some embodiments of the present invention comprise a double-gate transistor formed over a buried dielectric layer disposed on a handle wafer. These embodiments are analogous to a double-gate transistor formed on a semiconductor-on-insulator substrate. In these embodiments, the active layer of the substrate acts as the lower gate conductor. The remaining dielectric and semiconductor layers that compose the double-gate transistor are epitaxially grown on this active layer. In these embodiments, the dielectric layers have single-phase crystal structure and the semiconductor layers have single-crystal or single-phase crystal structure.

A distinguishing feature of the compositions disclosed herein is the morphology of the rare-earth dielectric and the morphology of the semiconductor. In particular, the rare-earth dielectric exhibits single-phase morphology and the semiconductor exhibits single-crystal morphology. In some embodiments, both the rare-earth dielectric and the semiconductor exhibit single-phase morphology. The single-crystal (or single-phase) morphology of the semiconductor is, in fact, enabled by single-phase morphology of the underlying rare-earth dielectric layer.

The presence of single-phase materials in the compositions disclosed herein results in high-quality dielectric/semiconductor interfaces, such as are required for high-performance devices and circuits. Furthermore, rare-earth dielectric layers that exhibit single-phase morphology, as disclosed herein, do not suffer from either an upper or lower limitation on thickness, as are exhibited in the prior art.

Some embodiments of the present invention comprise a single-crystal semiconductor gate disposed on a single-phase rare-earth gate dielectric disposed on a single-phase semiconductor active layer disposed on a single-phase rare-earth gate dielectric disposed on a single-crystal semiconductor gate disposed on a substrate:

| Single-crystal semiconductor gate |
| Single-phase rare-earth gate dielectric |
| Single-phase semiconductor active layer |
| Single-phase rare-earth gate dielectric |
| Single-crystal semiconductor gate |
| Substrate |

In some embodiments, compositions disclosed herein comprise high-K dielectric layers and semiconductor layers that are as thin as a few nanometers, yet which retain single-phase morphology and high-quality interfaces. Layers such as these enable the formation of double-gate transistors with mitigated short-channel effects, improved transistor operation, more robust electrical circuits due to mitigated floating body effects.

DETAILED DESCRIPTION

The following terms are defined for use in this Specification, including the appended claims:

Layer means a substantially-uniform thickness of a material covering a surface. A layer can be either continuous or discontinuous (i.e., having gaps between regions of the material). For example, a layer can completely cover a surface, or be segmented into discrete regions, which collectively define the layer (i.e., regions formed using selective-area epitaxy).

Disposed on means "exists on" an underlying material or layer. This layer may comprise intermediate layers, such as transitional layers, necessary to ensure a suitable surface. For example, if a material is described to be "disposed on a substrate," this can mean either (1) the material is in intimate contact with the substrate; or (2) the material is in contact with one or more transitional layers that reside on the substrate.

Single-crystal means a crystalline structure that comprises substantially only one type of unit-cell. A single-crystal layer, however, may exhibit some crystalline defects such as stacking faults, dislocations, or other commonly occurring crystalline defects.

Single-domain means a crystalline structure that comprises substantially only one structure of unit-cell and substantially only one orientation of that unit cell. In other words, a single-domain crystal is a single-crystal crystalline structure that exhibits no twinning or anti-phase domains.

Single-phase means a crystalline structure that is both single-crystal and single-domain.

Substrate means the material on which deposited layers are formed. Exemplary substrates include, without limitation: bulk silicon wafers, in which a wafer comprises a homogeneous thickness of single-crystal silicon; composite wafers, such as a silicon-on-insulator wafer that comprises a layer of silicon that is disposed on a layer of silicon dioxide that is disposed on a bulk silicon handle wafer; or any other material that serves as base layer upon which, or in which, devices are formed. Examples of such other materials that are suitable, as a function of the application, for use as substrate layers and bulk substrates include, without limitation, germanium, alumina, gallium-arsenide, indium-phosphide, silica, silicon dioxide, borosilicate glass, Pyrex, and sapphire.

Miscut Substrate means a substrate which comprises a surface crystal structure that is oriented at an angle to that associated with the crystal structure of the substrate. For example, a 6° miscut <100> silicon wafer comprises a <100> silicon wafer that has been cut at an angle to the <100> crystal orientation by 6° toward another major crystalline orientation, such as <110>. Typically, but not necessarily, the miscut will be up to about 20 degrees. Unless specifically noted, the phrase "miscut substrate" includes miscut wafers having any major crystal orientation. That is, a <111> wafer miscut toward the <011> direction, a <100> wafer miscut toward the <110> direction, and a <011> wafer miscut toward the <001> direction.

Electrically-connected means connected directly without intervening electronic or electrical elements. Two points that are electrically-connected are at substantially the same voltage for any value of current flow (neglecting any voltage drop that occurs due to the resistivity of a conductor that interconnects the two points).

Semiconductor-on-Insulator means a composition that comprises a single-crystal semiconductor layer, a single-phase dielectric layer, and a substrate, wherein the dielectric layer is interposed between the semiconductor layer and the substrate. This structure is reminiscent of prior-art silicon-on-insulator ("SOI") compositions, which typically include a single-crystal silicon substrate, a non-single-phase dielectric layer (e.g., amorphous silicon dioxide, etc.) and a single-crystal silicon semiconductor layer. Several important distinctions betweens prior-art SOI wafers and the inventive semiconductor-on-insulator compositions are that:

Semiconductor-on-insulator compositions include a dielectric layer that has a single-phase morphology, whereas SOI wafers do not. In fact, the insulator layer of typical SOI wafers is not even single crystal.

Semiconductor-on-insulator compositions include a silicon, germanium, or silicon-germanium "active" layer, whereas prior-art SOI wafers use a silicon active layer. In other words, exemplary semiconductor-on-insulator compositions in accordance with the invention include, without limitation: silicon-on-insulator, germanium-on-insulator, and silicon-germanium-on-insulator.

In some embodiments, the semiconductor-on-insulator compositions that are disclosed herein include additional layers between the semiconductor layer and the substrate.

Figure 1:
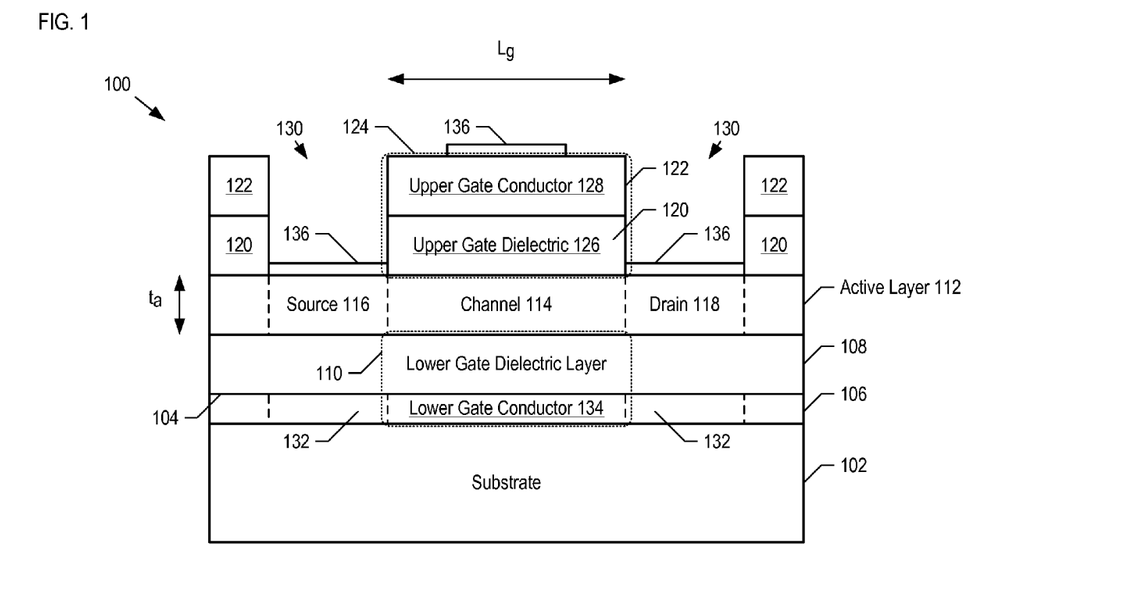
FIG. 1 depicts a cross-sectional view of a planar, double-gate transistor structure in accordance with an illustrative embodiment of the present invention.

FIG. 1 depicts a cross-sectional view of a planar, double-gate transistor structure in accordance with an illustrative embodiment of the present invention. Transistor 100 is formed in a bulk semiconductor substrate. The crystal structure of each of the dielectric and semiconductor layers that compose transistor 100 is either single-phase or single-crystal. Each of these layers is deposited using atomic-layer epitaxy, as described in U.S. patent application Ser. No. 11/254,031.

As depicted in FIG. 1, transistor 100 comprises: substrate 102; lower gate stack 110; active layer 112, having channel 114, source 116, and drain 118; upper gate stack 124, and electrical contacts 136. Lower gate stack 110 comprises lower gate conductor 134 and lower gate dielectric layer 108. Upper gate stack comprises upper gate dielectric 126 and upper gate conductor 128.

Figure 4:
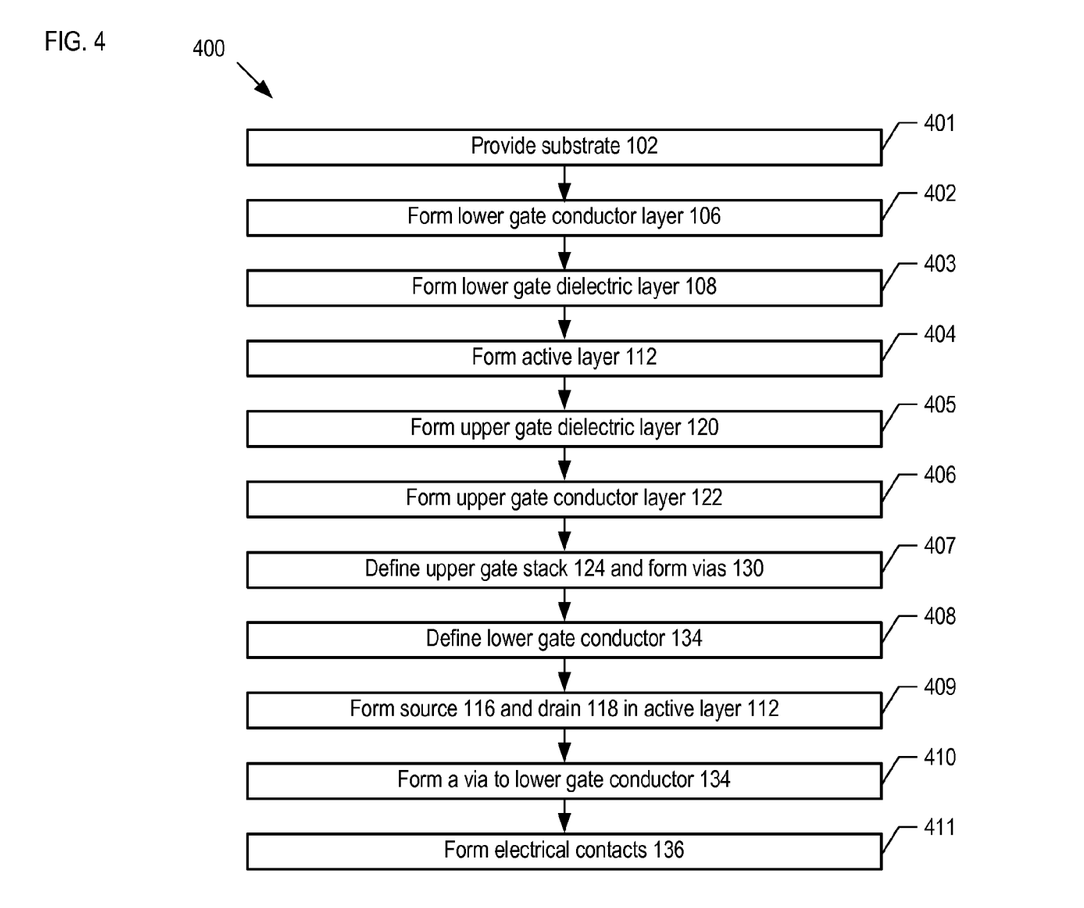
FIG. 4 depicts a method for forming a planar, double-gate transistor in accordance with the illustrative embodiment of the present invention.

Referring now to FIG. 4, and with continuing reference to FIG. 1, the structure of transistor 100 is described in conjunction with method 400, which describes operations suitable for fabricating transistor 100.

Method 400 begins with operation 401, in which substrate 102 is provided. Substrate 102 is a mis-cut silicon wafer. Substrate 102 has a predominantly <100> crystal orientation, but is mis-cut such that the orientation of surface 104 is at an angle to the <100> crystal orientation by 6° toward the <110> crystal orientation. Surface 104, therefore, supports the formation of a rare-earth dielectric layer having a single-phase crystal structure. Although surface 104 is mis-cut by 6° toward the <110> crystal orientation, it will be clear to those skilled in the art, after reading this specification, how to make and use alternative embodiments of the present invention wherein surface 104 is otherwise modified to support the formation of a rare-earth dielectric layer having a single-phase crystal orientation. In some alternative embodiments, substrate 102 is a wafer other than <100> silicon. Other suitable substrate materials include, without limitation, <111> silicon, <011> silicon, <100> silicon, miscut <111> silicon, miscut <011> silicon, germanium, and miscut germanium.

At operation 402, lower gate conductor layer 106 is formed in substrate 102. Lower gate conductor layer 106 is a region of substrate 102 that has been highly-doped so as to be electrically conductive. Lower gate conductor layer 106 is doped using conventional methods, such as ion implantation, diffusion, and the like. Surface 104 retains its crystal structure after substrate 102 has been doped. In some alternative embodiments of the present invention, lower gate conductor layer 106 comprises a layer of single-crystal silicon that is epitaxially-grown on surface 104. This layer of single-crystal silicon grows with substantially the same crystal orientation as surface 104, and can be either doped in-situ, or after deposition through conventional means.

At operation 403, lower gate dielectric layer 108 is formed on surface 104. Lower gate dielectric layer 108 is epitaxially-grown on and monolithically-integrated with surface 104. In some embodiments, lower gate dielectric layer 108 is a layer of erbium oxide having a thickness of approximately 1 nanometer (nm).

Among any other purposes, lower gate dielectric layer 108 provides a high-K dielectric layer that electrically isolates lower gate conductor 134 from active layer 112. Although in the illustrative embodiment, lower gate dielectric layer 108 comprises erbium oxide, it will be clear to those skilled in the art, after reading this specification, how to make and use alternative embodiments of the present invention wherein lower gate dielectric layer 108 comprises a different rare-earth dielectric. Additional materials suitable for use as lower gate dielectric layer 108 include, without limitation:

i. other rare-earth oxides, such as oxides of ytterbium, dysprosium, holmium, thulium, and lutetium; or ii. rare-earth nitrides, such as nitrides of erbium, ytterbium, dysprosium, holmium, thulium, and lutetium; or iii. rare-earth phosphides, such as phosphides of erbium, ytterbium, dysprosium, holmium, thulium, and lutetium; or iv. rare-earth oxynitrides, such as oxynitrides of erbium, ytterbium, dysprosium, holmium, thulium, and lutetium; or v. rare-earth oxyphosphides, such as oxyphosphides of erbium, ytterbium, dysprosium, holmium, thulium, and lutetium; or vi. any combination of i, ii, iii, iv, and v.

The thickness of lower gate dielectric layer 108 is typically in the range of 0.5 to 10 nm. More typically, the thickness of lower gate dielectric layer 108 is in the range of 0.5 to 2 nm.

At operation 404, active layer 112 is formed on lower gate dielectric layer 108. Active layer 112 is a layer of single-phase silicon that has a thickness, $t_a$, of 4 nm. Active layer 112 is epitaxially-grown on and monolithically-integrated with lower gate dielectric layer 108. Active layer 112 is suitable for formation of high-performance integrated circuits. Although the illustrative embodiment comprises active layer 112 that is silicon, it will be clear to those skilled in the art, after reading this specification, how to make and use alternative embodiments of the present invention wherein active layer 112 comprises:

i. silicon carbide; or ii. germanium; or iii. silicon-germanium; or iv. any combination of i, ii, iii, and silicon.

In some additional embodiments, active layer 112 comprises a compound III-V or II-VI semiconductor, such as indium phosphide, gallium arsenide, indium gallium arsenide, indium gallium phosphide, indium gallium arsenide phosphide, indium gallium nitride, and the like.

The thickness of active layer 112, $t_a$, scales with the gate length, $L_g$, of transistor 100. Specifically, $t_a$ scales as $t_a \sim L_g/k$, where k is a unitless scaling factor, and where the value of k is within the range of 3 to 5. In some embodiments, suitable values for the thickness of active layer 112 are within the range of approximately 2 nm to approximately 50 nm. It is anticipated that future technology nodes (such as the 30 nm technology node) may require an active layer as thin as approximately 2 nm.

At operation 405, upper gate dielectric layer 120 is formed on active layer 112. Upper gate dielectric layer 120 is epitaxially-grown and monolithically-integrated with active layer 112. Upper gate dielectric layer 120 has a single-phase crystal structure. Upper gate dielectric layer 120 is the material from which upper gate dielectric 126 is subsequently defined. In some embodiments, upper gate dielectric layer 120 comprises a different material selected from the materials listed above for lower gate dielectric layer 108.

The thickness of upper gate dielectric layer 120 determines the thickness of upper gate dielectric 126. In some embodiments, upper gate dielectric layer 120 is a layer of erbium oxide that has a thickness of 1 nm. In some embodiments, the thickness of upper gate dielectric layer 120 has a value within the range of approximately 0.5 nm to approximately 2 nm. As in the case of active layer 112, the desired thickness of upper gate dielectric layer 120 scales with the technology node of transistor 100. The thickness of upper gate dielectric layer 120 is typically in the range of 0.5 to 10 nm. More typically, the thickness of upper gate dielectric layer 120 is in the range of 0.5 to 2 nm.

At operation 406, upper gate conductor layer 122 is formed on upper gate dielectric layer 120. In some embodiments, upper gate conductor layer 122 is a layer of silicon that has a thickness of 20 nm. Upper gate conductor layer 122 is epitaxially-grown and monolithically-integrated with upper gate dielectric layer 120. Upper gate conductor layer 122 has a single-crystal crystal structure and is the material from which upper gate conductor 128 is subsequently defined.

Semiconductors suitable for use as upper gate conductor layer 122 include silicon, silicon-germanium, germanium, and silicon-carbide. In some alternative embodiments, upper gate conductor layer 122 comprises a compound III-V or II-VI semiconductor, such as indium phosphide, gallium arsenide, indium gallium arsenide, indium gallium phosphide, indium gallium arsenide phosphide, indium gallium nitride, and the like. In some embodiments, upper gate conductor layer 122 has a single-phase crystal structure. In some embodiments, upper gate conductor layer 122 has a thickness other than 20 nm.

In order to make upper gate conductor layer 122 ohmic, operation 406 continues with an implantation or diffusion of boron into upper gate conductor layer 122. This boron is then activated by a high-temperature anneal. It should be noted that the high-temperature anneal required to activate the boron creates a barrier to the use of some high-K dielectric materials for upper gate dielectric layer 120. For example, hafnium oxide (HfO) has been widely touted as a potential gate dielectric material. Hafnium oxide, however, undergoes a phase change when subjected high temperature, such as that associated with a boron activation anneal, which substantially precludes its use in this application.

The diffusivity of boron in single-crystal silicon is up to four orders of magnitude slower than the diffusivity of boron along grain boundaries. For several reasons, therefore, the single-crystal nature of upper gate conductor layer 122 and upper gate dielectric layer 120 provide some relief for the well-known boron-poisoning problem associated with conventional polysilicon/silicon dioxide gate stacks.

In particular, since upper gate dielectric layer 120 has a single-phase crystal structure, boron diffusivity in it is lower than in amorphous silicon dioxide. Second, upper gate conductor layer 122 has a single-crystal crystal structure (i.e., it is substantially grain boundary-free), which further mitigates the boron-diffusion problem. Finally, in those embodiments wherein upper gate conductor layer 122 has single-phase crystal structure, the boron diffusion problem is expected to be mitigated still further.

As previously indicated, in the illustrative embodiment of the present invention, the upper gate conductor has a single-crystal crystal structure. But in some other embodiments, the upper gate conductor does not possess a single-crystal crystal structure. Rather, in some of these other embodiments, the upper gate conductor is polycrystalline, amorphous, etc. It will be clear to those skilled in the art, after reading this specification, how to make and use alternative embodiments of the present invention wherein upper gate conductor layer 122 does not have a single-crystal crystal structure, Further, it will be clear how to make and use alternative embodiments of the present invention wherein upper gate conductor layer 122 comprises a non-semiconductor material, such as metals, electrically-conductive organics, and the like.

At operation 407, conventional patterning techniques are used to form vias 130. The formation of vias 130 also defines the structure of upper gate stack 124. Upper gate stack 124 comprises upper gate dielectric 126 and upper gate conductor 128. Vias 130 are formed to expose active layer 112 in preparation for doping source 116 and drain 118.

At operation 408, lower gate conductor 134 is defined. Oxygen is implanted through vias 126 and into isolation regions 132. This implanted oxygen causes isolation regions 132 to become substantially electrically non-conductive, thereby defining lower gate conductor 134. In some embodiments, an optional thermal anneal is performed to enhance the effect of the implanted oxygen on the electrical conductivity of isolation regions 132. In some embodiments, upper gate stack 124 acts as a hard-mask during oxygen implantation, thereby ensuring that upper gate stack 124 and lower gate stack 110 are substantially aligned.

At operation 409, source 116 and drain 118 are formed in active layer 112. Source 116 and drain 118 are formed within active layer 112 by diffusion or ion implantation of a suitable dopant. In some embodiments, source 116 and drain 118 are formed by converting the entire thickness of active layer 112 in the source and drain regions into silicide. In some embodiments of the present invention, upper gate conductor layer 122, source 116, and drain 118 are doped simultaneously, thereby obviating the gate conductor doping task associated with operation 406.

At operation 410, a via to lower gate conductor 134 is formed (for clarity, not shown in FIG. 1) using conventional photolithographic and etching techniques.

At operation 411, electrical contacts 136 are formed on upper gate conductor 128, source 116, drain 118, and lower gate conductor 134, in well-known fashion. In some embodiments, upper gate conductor 128 and lower gate conductor 134 are electrically-connected.

As described in U.S. patent application Ser. Nos. 11/253,525 and 11/254,031, in some embodiments, one or more transitional layers are present in the layer structure of transistor 100. These transitional layers enable the growth of:
 i. single-phase rare-earth dielectric material on semiconductor material; or
 ii. single-crystal semiconductor material on rare-earth dielectric material; or
 iii. single-phase semiconductor material on rare-earth dielectric material; or
 iv. any combination of i, ii, and iii.

Crystal Structure of Rare-Earth Dielectrics

Charge carrier mobility in a single-crystal layer is higher than in a non-single crystal active layer. In addition, epitaxial deposition of a single-crystal active layer on a non-single-crystal buried dielectric would be difficult at best. A transistor structure in accordance with the present invention, therefore, comprises: (1) a lower gate dielectric layer 108 and upper gate dielectric layer 120 that each have a single-phase crystal structure; and (2) an active layer 112 that has a single-crystal crystal structure, and, preferably, a single-phase crystal structure.

Epitaxial growth of single-phase semiconductor films is well-known to those skilled in the art. But such films are typically only grown on an underlying single-crystal semiconductor. Epitaxial growth of single-phase high-K dielectrics has been, heretofore, unknown to those skilled in the art. This section, therefore, addresses important considerations in selecting and growing single-phase, high-K, rare-earth dielectrics and single-phase semiconductors on dielectric layers.

As compared to other high-K dielectric films, single-phase rare-earth dielectric layers provide several key advantages regarding their use in integrated circuit devices. Specifically, these films enable:
 i. thicker gate layers and buried dielectric layers; or
 ii. semiconductor-on-insulator structures with buried dielectric and active layers that do not exhibit a growth-thickness limitation; or
 iii. low thermionic emission of electrons across the dielectric/semiconductor interface; or
 iv. semiconductor/dielectric interfaces that exhibit a quality and defect density which rivals or surpasses that of silicon dioxide on silicon; or
 v. fabrication of semiconductor-on-insulator structures that comprise a single-crystal semiconductor layer with a thickness of 100 nanometers or less; or
 vi. any combination of i, ii, iii, iv, and v.

Dielectric films that incorporate rare-earth metals are potentially a means for providing high-K dielectric films. The term "potentially" is used because there are several important caveats to the use of rare-earth metals. Specifically, the crystal structure of rare-earth dielectrics can vary significantly. And the crystal structure, in part, renders many of these otherwise acceptable rare earth dielectrics inappropriate for use in high-performance integrated circuits.

Furthermore, the crystal structure of a rare-earth dielectric can affect the quality of epitaxially-grown films that are deposited on top of the rare-earth dielectric. For example, lower gate dielectric layer 108 must have high interface quality and a single-phase morphology to enable the formation of fully-depleted electrical devices in active layer 112. Rare-earth dielectrics deposited using methods that are known in the prior art are ill-suited to the formation of fully-depleted transistor devices.

Rare-earth oxides are known to exhibit fluorite-type structures. These structures exhibit morphology differences as a function of the atomic weight of the rare-earth cation present in the oxide, among any other factors.

In particular, oxides comprising lighter rare-earths form cubic $CaF_2$-type crystal structure as a result of possible ionization states of +2 and/or +3 and/or +4. Oxides having this crystal structure exhibit significant net charge defect due to a multiplicity of possible oxidation states (for rare-earth oxides). This renders these rare-earth oxides inapplicable to high-performance field-effect-transistor (FET) devices. These oxides are not suitable for use in conjunction with the various embodiments of the present invention.

The layer thickness of rare-earth dielectrics is limited when grown via prior-art methods. In general, this limitation arises from lattice mismatch, internal strain, and/or electronic or structural instability of the crystal structure of the rare-earth oxides. Annealing rare-earth oxides that are formed via prior-art methods, such as hafnium oxide, in order to reduce strain undesirably results in mixed crystal phases (i.e., polycrystalline or amorphous). Layer thickness far exceeding that achieved in the prior art can be attained for rare-earth dielectrics as disclosed herein.

On the other hand, oxides formed from heavier rare-earths (e.g., $RE_2O_3$, etc.), exhibit a distorted $CaF_2$-type crystal structure which includes anion vacancies due to an ionization state of $RE^{3+}$. The crystal structure associated with rare-earth oxides of heavier rare earths is also known as "Bixbyite." These oxides are desirable for use as dielectric layers 108 and 120 in the compositions described herein.

Figure 2:
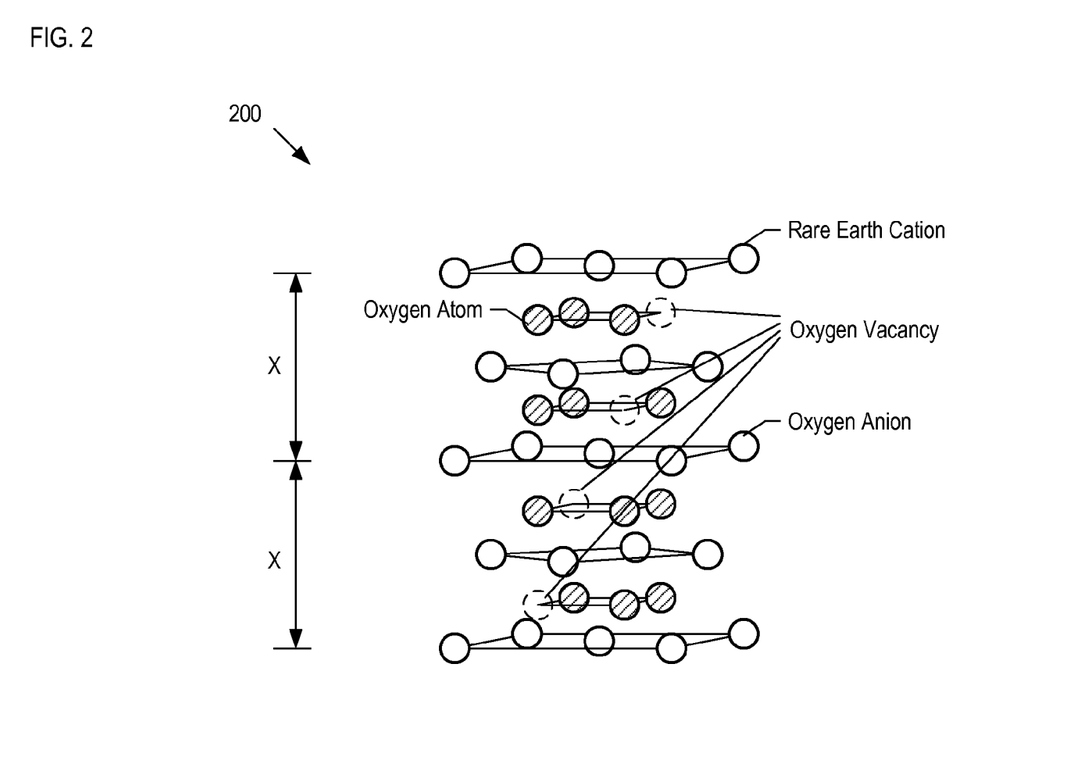
FIG. 2 depicts the crystal structure diagram of a unit cell of a rare-earth oxide having the formula $RE_2O_3$ in accordance with the illustrative embodiment of the present invention.

FIG. 2 depicts the crystal structure diagram of a unit cell of a rare-earth oxide having the formula $RE_2O_3$ in accordance with the illustrative embodiment of the present invention. Unit cell 200 is a unit cell of $Er^{+3}{}_2O_3$. The crystal structure of unit cell 200 is an oxygen-vacancy-derived fluorite derivative (i.e., Bixbyite structure). Lower gate dielectric layer 108 and upper gate dielectric layer 120 comprise an assemblage of these unit cells. The erbium atoms in unit cell 200 are in a triply-ionized $RE^{+3}$ ionization state.

The number and position of the anion vacancies determines the crystal shape of the $RE_2O_3$ unit cell. The crystal shape of this cell can be engineered to provide a suitable match to the lattice constant of the underlying semiconductor substrate. Oxygen vacancies along the body diagonal and/or the face diagonal lead to a C-type cubic structure as will be discussed below and with reference to FIG. 3. For example, two anion vacancies per fluorite unit cell causes the unit cell of $Er^{3+}{}_2O_3$ to increase to nearly twice the unit cell size of Si. This, in turn, enables low-strain, single-phase $Er^{3+}{}_2O_3$ to be epitaxially grown directly on a silicon substrate.

Furthermore, the number and position of the anion vacancies can be engineered to induce a desired strain (tensile or compressive) in the dielectric layer and/or overgrown layers. For example, in some embodiments, strain in the semiconductor layer is desired in order to affect charge carrier mobility.

Each fluorite unit cell has two oxygen vacancies, which lie along the body diagonal as shown. The presence of these two oxygen vacancies causes the $Er^{3+}{}_2O_3$ unit cell to double in size, thereby doubling its lattice constant, which provides a suitable match to the lattice constant of <100> silicon.

In some alternative embodiments, oxygen vacancies lie at the ends of the face diagonal. In some other alternative embodiments, oxygen vacancies are distributed between the ends of the face diagonal and the body diagonal.

Certain factors must be addressed to produce a composition that includes a dielectric layer comprising a single-phase rare-earth dielectric. In particular:

(1) rare-earth metals having an atomic number of 65 or less, such as cerium, promethium, or lanthanum, form cations with radii larger than 0.93 angstroms, which is unsuitable for use in embodiments of the present invention; and (2) the growth of a polar rare-earth oxide (which comprises cations and anions) on a non-polar substrate (such as silicon or germanium) tends toward multi-domain growth due to the lack of an energetically-favorable bonding site for one of either the cations or anions of the rare-earth dielectric.

Figure 3:
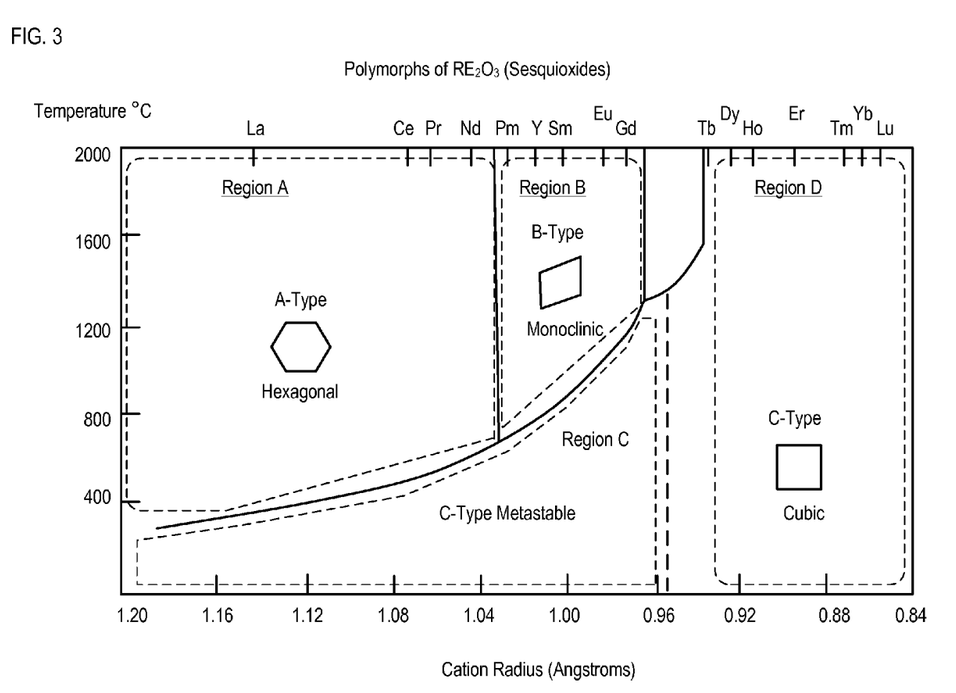
FIG. 3 depicts a chart of the polymorphs of rare-earth oxides versus temperature and as a function of cation radius.

The uniformity and stability of the crystal structure of a rare-earth oxide is dependent upon the radius of the included rare-earth cation. FIG. 3 depicts a chart of the polymorphs of rare-earth oxides versus temperature and as a function of cation radius.

Regions A through C are regions of temperature and cation radius wherein the crystal structure of the polymorphs of rare-earth oxides are unstable and are not limited to a single type over all temperatures. Therefore, rare-earth oxides formed using these rare-earth elements will exhibit polycrystalline or multi-domain crystal structure. Such oxides are undesirable for use in conjunction with the compositions that are disclosed herein.

For example, the crystal structure of a rare-earth oxide comprising lanthanum, which has a cation radius of 1.14, changes as the temperature of the crystal reduces from growth temperature to room temperature. The crystal structure of such a lanthanum-oxide will change from an A-type hexagonal structure above 400° C. to a C-type metastable structure below 400° C.

Region D is the only region wherein the rare-earth oxide polymorphs are stable over the temperature range from room temperature to 2000° C. The rare-earth oxide polymorphs that exist in region C include sesquioxides that have a cation radius less than 0.93. The rare-earth elements that have cation radii less than 0.93 include dysprosium, holmium, erbium, thulium, ytterbium, and lutetium. These rare-earth elements are also characterized by an atomic number greater than or equal to 66. These rare-earth metals, therefore, will form a stable oxygen-vacancy-derived fluorite crystal structure (i.e., Bixbyite) that exhibits single-phase structure. Consequently, rare-earth metals that are suitable for use in conjunction with the illustrative embodiment include dysprosium, holmium, erbium, thulium, ytterbium, and lutetium.

Rare-earth dielectrics are typically polar. Growing polar rear-earth dielectrics on a non-polar substrate (such as silicon or germanium) usually results in multi-domain growth, which is unacceptable for use in conjunction with the present invention. In accordance with the present invention, specific techniques are employed to ensure single-phase growth of a polar layer on a non-polar surface and/or a non-polar layer on a polar surface.

In order to form a semiconductor-on-insulator structure that is suitable for high-performance FET devices, active layer 112 should have a single-crystal, and preferably a single-phase, crystal structure. The optimal deposition surface for producing a single-phase active layer (e.g., silicon, germanium, silicon-carbide, or silicon-germanium) via epitaxy is non-polar, since silicon and germanium are non-polar crystals. But most rare-earth dielectrics typically comprise polar crystals. In accordance with the present invention, specific techniques are employed to ensure epitaxial growth of single-phase non-polar semiconductors on polar surfaces.

The methods employable for growing non-polar semiconductors on polar surfaces and single-phase growth of polar dielectrics on non-polar surfaces are disclosed in detail in U.S. patent application Ser. Nos. 11/253,525 and 11/254,031.

Figure 5A:
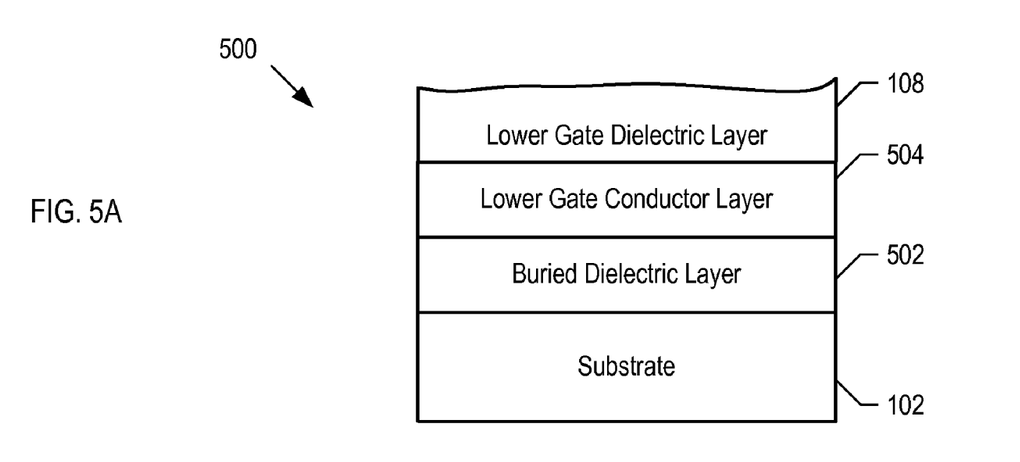
FIG. 5A depicts a cross-sectional view of a portion of a semiconductor-on-insulator substrate comprising a buried dielectric layer in accordance with an alternative embodiment of the present invention.

FIG. 5A depicts a cross-sectional view of a portion of a semiconductor-on-insulator substrate comprising a buried dielectric layer in accordance with an alternative embodiment of the present invention. Partial layer structure 500 comprises substrate 102, buried dielectric layer 502, lower gate conductor layer 504, and lower gate dielectric layer 108. Buried dielectric layer 502 acts to electrically isolate circuitry formed in the layers disposed on it from substrate 500.

Buried dielectric layer 502 is a layer of erbium oxide having a thickness of approximately 10 nanometers (nm). Buried dielectric layer 502 is epitaxially-grown on and monolithically-integrated with substrate 102. Although in the illustrative embodiment buried dielectric layer 502 comprises erbium oxide, it will be clear to those skilled in the art, after reading this specification, how to make and use alternative embodiments of the present invention wherein buried dielectric layer 502 comprises a different rare-earth dielectric. Additional materials suitable for use as buried dielectric layer 502 include, without limitation:

i. other rare-earth oxides, such as oxides of ytterbium, dysprosium, holmium, thulium, and lutetium; or
ii. rare-earth nitrides, such as nitrides of erbium, ytterbium, dysprosium, holmium, thulium, and lutetium; or
iii. rare-earth phosphides, such as phosphides of erbium, ytterbium, dysprosium, holmium, thulium, and lutetium; or
iv. rare-earth oxynitrides, such as oxynitrides of erbium, ytterbium, dysprosium, holmium, thulium, and lutetium; or
v. rare-earth oxyphosphides, such as oxyphosphides of erbium, ytterbium, dysprosium, holmium, thulium, and lutetium; or
vi. any combination of i, ii, iii, iv, and v.

The thickness of buried dielectric layer 502 is typically in the range of 0.5 to 5000 nm. More typically, the thickness of buried dielectric layer 502 is in the range of 1 to 10 nm or 10 to 100 nm.

Lower gate conductor 504 is a layer of single-phase silicon that has a thickness within the range of approximately 2 nm to 20 nm. Lower gate conductor 504 is epitaxially-grown on and monolithically-integrated with buried dielectric layer 502. In some embodiments, lower gate conductor 504 has a single-crystal crystal structure. In these applications, however, the crystal structure of lower gate conductor 504 is supportive of the epitaxial growth of lower gate dielectric layer 108, such that lower gate dielectric layer 108 has a single-phase crystal structure.

Figure 5B:
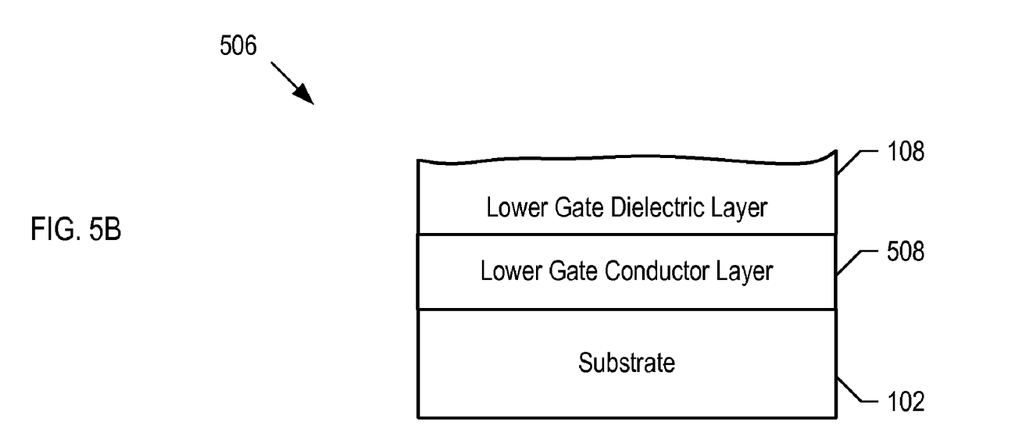
FIG. 5B depicts a cross-sectional view of a portion of a semiconductor-on-insulator substrate comprising a lower gate conductor in accordance with an alternative embodiment of the present invention.

FIG. 5B depicts a cross-sectional view of a portion of a semiconductor-on-insulator substrate comprising a lower gate conductor in accordance with an alternative embodiment of the present invention. Partial layer structure 506 comprises substrate 102, lower gate conductor layer 508, and lower gate dielectric layer 108.

Lower gate conductor 508 is a layer of rare-earth silicide having a thickness of approximately 10 nm. In some embodiments, the thickness of lower gate conductor 508 is within the range of approximately 1 monolayer of silicide to approximately 20 nm. One method for forming lower gate conductor 508 includes an epitaxial deposition of a layer of rare-earth metal directly on silicon substrate 102. This deposition is followed by a thermal anneal, which induces the rare-earth metal to react with the silicon atoms at the top surface of substrate 102. This reaction results in a layer of electrically-conductive rare-earth silicide. It should be noted that lower gate conductor 508 is supportive of the epitaxial growth of lower gate dielectric layer 108, such that lower gate dielectric layer 108 has a single-phase crystal structure.

Figure 6:
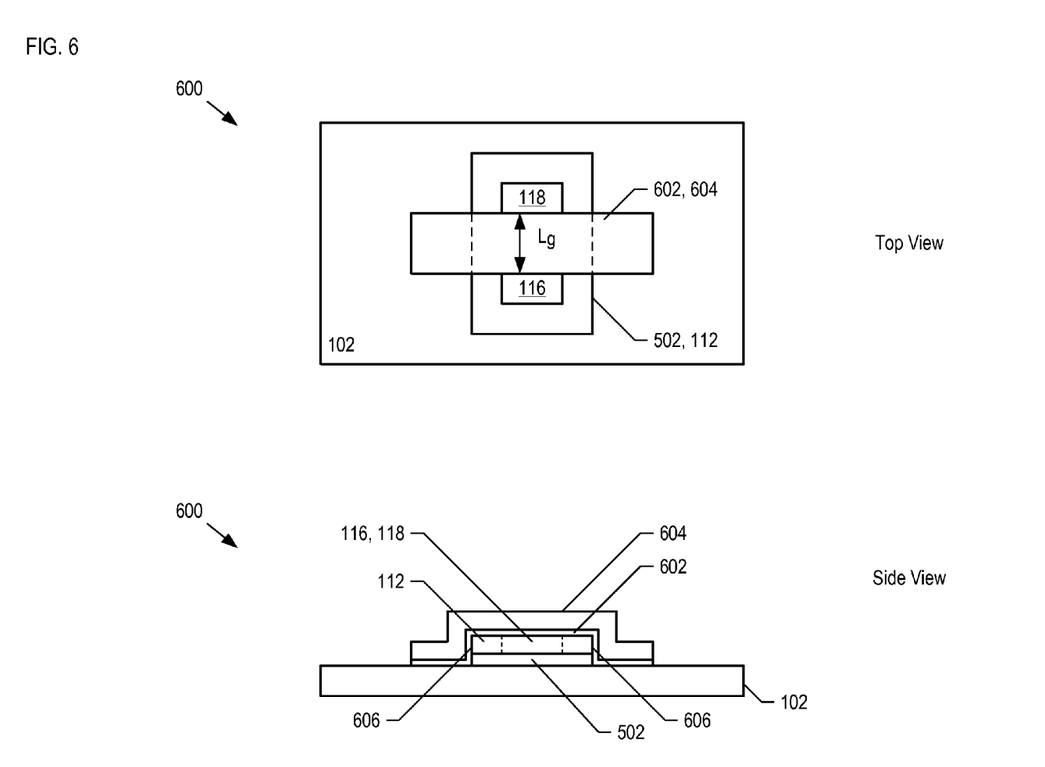
FIG. 6 depicts schematics of a top view and side view of a planar, surround-gate transistor in accordance with an alternative embodiment of the present invention.

FIG. 6 depicts schematics of a top view and side view of a planar, surround-gate transistor in accordance with an alternative embodiment of the present invention. As depicted in FIG. 6, transistor 600 comprises: substrate 102, buried dielectric layer 502, active layer 112, gate dielectric layer 602, gate conductor layer 604, source 606, drain 608, and electrical contacts to the substrate, gate, source, and drain. For clarity, the electrical contacts are not shown in FIG. 6.

Figure 7:
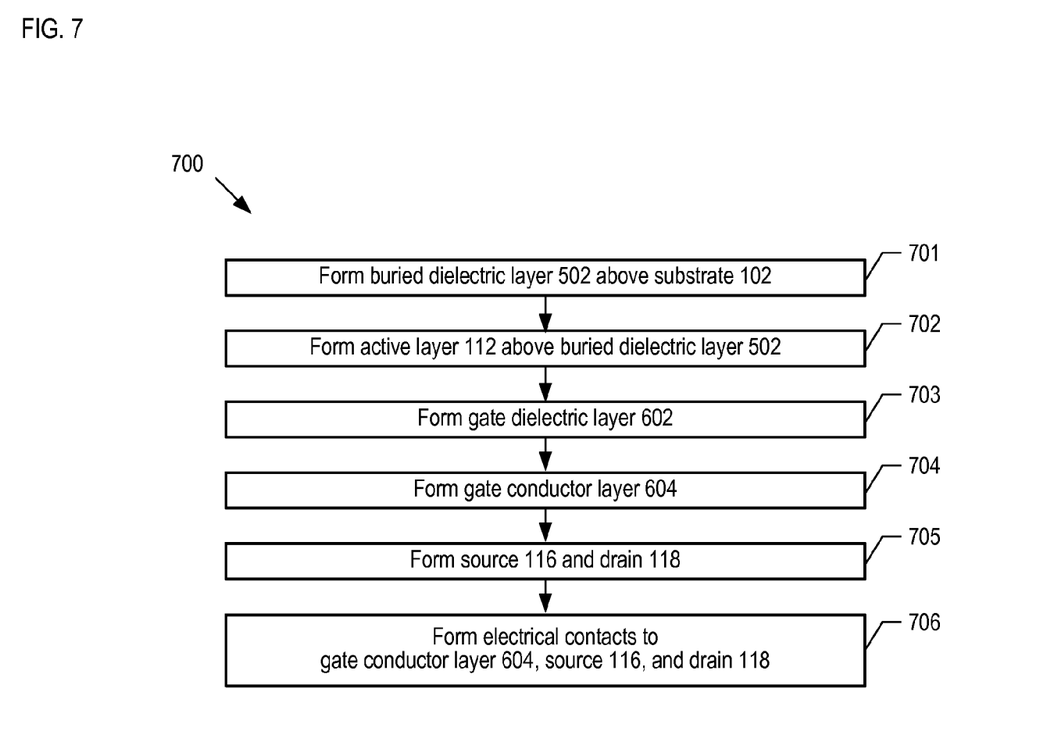
FIG. 7 depicts a method for forming a planar, surround-gate transistor in accordance with an alternative embodiment of the present invention.

Referring now to FIG. 7, and with continuing reference to FIG. 6, the structure of transistor 600 is described in conjunction with method 700, which describes operations suitable for fabricating transistor 600.

Method 700 begins with operation 701, in which buried dielectric layer 502 is formed on substrate 102. Buried dielectric layer 502 is formed using selective-area epitaxial-deposition.

At operation 702, active layer 112 is formed on buried dielectric layer 502 using selective-area epitaxial-deposition.

At operation 703, gate dielectric layer 602 is formed using selective-area epitaxial-deposition. Gate dielectric layer 602 is comparable to either of lower gate dielectric layer 106 and upper gate dielectric layer 120, as described above and with respect to FIG. 1. Gate dielectric layer 602 conforms to the topography of underlying active layer 112, thereby covering sidewalls 606 (i.e., gate dielectric layer 602 is conformally-deposited on active layer 112).

At operation 704, gate conductor layer 604 is formed on gate dielectric layer 602 using selective-area epitaxial-deposition techniques. Gate conductor layer 604 is a layer of single-crystal silicon that has a thickness of 20 nm. Gate conductor layer 604 is comparable to upper gate conductor layer 122 described above and with respect to FIG. 1. Gate conductor layer 604 conforms to the topography of underlying gate dielectric layer 602, thereby covering sidewalls 606 (i.e., gate conductor layer 604 is conformally-deposited on gate dielectric layer 602). In some alternative embodiments, gate conductor layer 604 comprises a material other than single-crystal silicon. Suitable materials for use in gate conductor layer 604 include, without limitation: polycrystalline or amorphous layers of silicon, germanium, silicon-germanium, silicon-carbide, or doped rare-earth dielectrics; rare-earth silicides, non-rare earth silicides, and metals.

By virtue of the fact that gate dielectric layer 602 and gate conductor layer 604 deposit on the sides of the active layer, gate conductor layer 604 acts as a pair of vertically-oriented gate electrodes. As a result, transistor 600 operates in similar fashion to prior-art vertical-gate transistors, such as FINFET and triple-gate MOSFET structures. In contrast to vertical-gate transistors, however, the topography of the layers that compose surround-gate transistor 600 is similar to the layers of a conventional planar transistor. The present invention, therefore, provides a transistor structure that displays the operational benefits of exotic vertical-gate transistor structures, but without at least some of the complexity and expense associated with their fabrication.

At task 705, source 116 and drain 118 are formed as described above and with respect to FIG. 1.

At task 706, electrical contacts to gate conductor layer 604, source 606, and drain 608 are formed in conventional fashion.

Although in the embodiment described in FIGS. 6 and 7 the semiconductor layers and dielectric layers are deposited using selective-area deposition techniques, it will be clear to those skilled in the art, after reading this specification, how to make and use alternative embodiments of the present invention in which any or all of the semiconductor and dielectric layers are deposited using conventional full-surface deposition and post-deposition patterning techniques.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. A transistor structure comprising:
   a first semiconductor layer, wherein said first semiconductor layer comprises a first semiconductor, and wherein said first semiconductor layer has a substantially single-crystal crystal structure;
   a first gate stack comprising a first gate dielectric layer and a first gate conductor layer, wherein said first gate dielectric layer comprises a first rare-earth metal, and wherein said first gate dielectric layer has a substantially single-phase crystal structure; and
   a second gate stack comprising a second gate dielectric layer and a second gate conductor layer, wherein said second gate dielectric layer comprises a second rare-earth metal, and wherein said second gate dielectric layer has a substantially single-phase crystal structure;
   wherein said first semiconductor layer interposes said first gate dielectric layer and said second gate dielectric layer, and wherein said first gate dielectric layer interposes said first semiconductor layer and said first gate conductor layer, and further wherein said second gate dielectric layer interposes said first semiconductor layer and said second gate conductor layer.

2. The transistor structure of claim 1 wherein said first gate dielectric layer comprises at least one of a rare-earth oxide, a rare-earth oxynitride, a rare-earth nitride, a rare-earth oxyphosphide, and a rare-earth phosphide, and wherein said second gate dielectric layer comprises at least one of a rare-earth oxide, a rare-earth oxynitride, a rare-earth nitride, a rare-earth oxyphosphide, and a rare-earth phosphide.

3. The transistor structure of claim 1 wherein said first rare-earth metal is individually selected from the group consisting of erbium, ytterbium, dysprosium, holmium, thulium, and lutetium, and wherein said second rare-earth metal is individually selected from the group consisting of erbium, ytterbium, dysprosium, holmium, thulium, and lutetium.

4. The transistor structure of claim 1 wherein at least one of said first rare-earth metal and said second rare-earth metal forms a cation having a radius less than 0.93 angstroms.

5. The transistor structure of claim 1 wherein at least one of said first rare-earth metal and said second rare-earth metal has an atomic number greater than or equal to 66.

6. The transistor structure of claim 1 wherein at least one of said first rare-earth metal and said second rare-earth metal is in a $RE^{3+}$ ionization state.

7. The transistor structure of claim 1 wherein at least one of said first gate dielectric layer and said second gate dielectric layer has an anion-vacancy-derived fluorite-crystal crystal structure.

8. The transistor structure of claim 1 further comprising a substrate having an electrically-conductive surface, and wherein said first gate conductor layer comprises said electrically-conductive surface.

9. The transistor structure of claim 1 further comprising a substrate having a second semiconductor layer disposed on a buried dielectric layer, wherein said second semiconductor layer has a substantially single-crystal crystal structure, and wherein said first gate conductor comprises said second semiconductor layer.

10. The transistor structure of claim 1 wherein said first gate conductor layer comprises a silicide comprising a third rare-earth metal.

11. The transistor structure of claim 1 wherein said first semiconductor layer has a thickness that is within the range of approximately 5 nm to approximately 25 nm.

12. The transistor structure of claim 1 wherein said first semiconductor layer has a thickness that is within the range of approximately 0.5 nm to approximately 5 nm.

13. The transistor structure of claim 1 wherein said first semiconductor layer is selected from the group consisting of silicon, germanium, silicon-germanium, and silicon-carbide.

14. The transistor structure of claim 1 wherein said first gate dielectric layer has a thickness within the range of approximately 0.5 nm to approximately 100 nm.

15. The transistor structure of claim 1 wherein said first gate dielectric layer has a thickness within the range of approximately 0.5 nm to approximately 10 nm.

16. The transistor structure of claim 1 wherein said first gate dielectric layer has a thickness within the range of approximately 0.5 nm to approximately 2 nm.

17. The transistor structure of claim 1 wherein said second gate dielectric layer has a thickness within the range of approximately 0.5 nm to approximately 10 nm.

18. The transistor structure of claim 1 wherein said second gate dielectric layer has a thickness within the range of approximately 0.5 nm to approximately 2 nm.

19. The transistor structure of claim 1 wherein said first gate conductor layer and said second gate conductor layer are electrically-connected.

20. The transistor structure of claim 1 wherein said first gate conductor layer has a first gate length, and wherein said second gate conductor layer has a second gate length; wherein said first gate length and said second gate length are equal.

21. A transistor structure comprising:
   a substrate comprises a lower gate conductor layer, and wherein said lower gate conductor layer has a substantially single-crystal crystal structure;
   a lower gate dielectric layer disposed on said lower gate conductor layer, wherein said lower gate dielectric layer comprises a first rare-earth metal, and wherein said lower gate dielectric layer has a substantially single-phase crystal structure;

a first semiconductor layer disposed on said lower gate dielectric layer, wherein said first semiconductor layer comprises a first semiconductor, and wherein said first semiconductor layer has a substantially single-crystal crystal structure;

an upper gate dielectric layer disposed on said first semiconductor layer, wherein said upper gate dielectric layer comprises a second rare-earth metal, and wherein said upper gate dielectric layer has a substantially single-phase crystal structure; and an upper gate conductor layer disposed on said upper gate dielectric layer.

22. The transistor structure of claim 21 wherein said upper gate conductor layer comprises a second semiconductor selected from the group consisting of silicon, germanium, silicon-germanium, and silicon-carbide, and wherein said second semiconductor has a substantially single-crystal crystal structure.

23. The transistor structure of claim 21 wherein said lower gate conductor layer comprises silicide comprising a third rare-earth metal.

24. The transistor structure of claim 21 wherein said lower gate conductor layer comprises a second semiconductor layer disposed on a buried dielectric, and wherein said second semiconductor layer has a substantially single-crystal crystal structure.

25. The transistor structure of claim 21 wherein said lower gate conductor layer and said upper gate conductor layer are electrically-connected.

26. The transistor structure of claim 21 wherein at least one of said lower gate dielectric layer and said upper gate dielectric layer comprises at least one of a rare-earth oxide, a rare-earth oxynitride, a rare-earth nitride, a rare-earth oxyphosphide, and a rare-earth phosphide.

27. The transistor structure of claim 21 wherein at least one of said lower gate dielectric layer and said upper gate dielectric layer has an anion-vacancy-derived fluorite-crystal crystal structure.

28. The transistor structure of claim 21 wherein at least one of said first rare-earth metal and said second rare-earth metal forms a cation having a radius less than 0.93 angstroms.

29. The transistor structure of claim 21 wherein at least one of said first rare-earth metal and said second rare-earth metal has an atomic number greater than or equal to 66.

30. The transistor structure of claim 21 wherein at least one of said first rare-earth metal and said second rare-earth metal is in a $RE^{3+}$ ionization state.

31. A transistor structure comprising:
a first dielectric layer disposed on a substrate;
a first semiconductor layer disposed on said first dielectric layer, wherein said first semiconductor layer has a substantially single-crystal crystal structure, and wherein said first semiconductor layer includes a source region and a drain region, and further wherein said first semiconductor layer has at least two sidewalls;

a second dielectric layer, wherein said second dielectric layer is disposed on at least said two sidewalls of said first semiconductor layer, and wherein said second dielectric layer comprises a rare-earth metal, and further wherein said second dielectric layer has a substantially single-phase crystal structure; and a gate conductor layer, wherein said gate conductor layer is disposed on said second dielectric layer, and wherein said second dielectric layer interposes each of said two sidewalls and said gate conductor layer.

32. A method comprising:
forming a lower gate conductor layer, wherein said lower gate conductor layer has a substantially single-crystal crystal structure;

forming a lower gate dielectric layer comprising a first rare-earth metal and having a single-phase crystal structure;

forming an first semiconductor layer, wherein said first semiconductor layer has a substantially single-crystal crystal structure; and forming a source region and a drain region in said first semiconductor layer;

wherein said lower gate dielectric layer interposes said lower gate conductor and said first semiconductor layer.

33. The method of claim 32 further comprising forming an upper gate dielectric layer comprising a second rare-earth metal and having a single-phase crystal structure.

34. The method of claim 33 further comprising forming an upper gate conductor layer having a single-crystal crystal structure.

35. The method of claim 34 wherein:
said lower gate dielectric layer is formed by epitaxial growth;
said first semiconductor layer is formed by epitaxial growth;
said upper gate dielectric layer is formed by epitaxial growth; and
said upper gate conductor layer is formed by epitaxial growth.

36. The method of claim 34 further comprising forming an electrical interconnect between said upper gate conductor and said lower gate conductor.

37. The method of claim 32 wherein said lower gate conductor layer is formed by forming a rare-earth silicide on a surface of a silicon substrate.

38. The method of claim 32 wherein said lower gate conductor layer is formed by disposing an electrically-conductive semiconductor layer on a buried dielectric layer that is disposed on a handle wafer.

39. The method of claim 38 wherein said lower gate conductor layer and said buried dielectric layer are formed by epitaxial growth.

* * * * *